Dec. 30, 1969 G. A. BUTERA 3,486,223

SOLDER BONDING

Filed April 27, 1967

INVENTOR.
GASPER A. BUTERA

BY

Harry W. Hargis III
AGENT

United States Patent Office 3,486,223
Patented Dec. 30, 1969

3,486,223
SOLDER BONDING
Gasper A. Butera, Norristown, Pa., assignor to Philco-Ford Corporation, Philadelphia, Pa., a corporation of Delaware
Filed Apr. 27, 1967, Ser. No. 634,386
Int. Cl. H05k 3/34; B23k 31/02
U.S. Cl. 29—626 10 Claims

ABSTRACT OF THE DISCLOSURE

A process for joining the bonding pads of an integrated microcircuit device to a printed circuit board. The device is oriented with reference to the printed circuit board and placed thereon so that bodies of solder on the pads make controlled pressure contact with aligned, pre-tinned metal conductors on the board. Heat is applied to the device to effect the solder bond, followed by cooling. The device is then reheated without applied pressure, followed by cooling. Upon such reheating, the device floats upon the remelted solder, causing the device to align itself more precisely with the metal conductors.

CROSS-REFERENCE TO RELATED APPLICATION

The present process is particularly directed to solder bonding of microcircuit devices prepared for bonding in accordance with teachings of the copending disclosure of Peter P. Idell, Ser. No. 627,341 filed Mar. 31, 1967, and assigned to the assignee of the present invention.

BACKGROUND OF THE INVENTION

This invention relates to solder bonding, and more particularly to a process for soldering the bonding pads of integrated microcircuit devices to printed circuit boards.

It has been found advantageous to provide for solder attachment of monolithic integrated microcircuit devices directly to printed circuit boards for the combined purposes of electrical and mechanical connection. A multiplicity of devices are frequently employed on a single printed circuit board, and solder attachment is preferred because it permits replacement of a device, should the need arise. Difficulties are encountered in mounting devices in this manner due to irregularities in sizes of the many, very small bodies of solder by which the connections are made, as well as irregularities in thicknesses of the printed circuits. Also, it is desirable to effect such solder attachment with resultant minimum strain on the solder connection, after the solder has hardened. It is therefore an objective of the invention to provide an improved method for solder bonding microcircuit devices directly to printed circuit boards, which method overcomes the aforementioned difficulties.

SUMMARY OF THE INVENTION

In preferred practice of the invention, a microcircuit device in chip form is positioned upon a printed circuit board to which it is to be mounted, and is pressed against the board with a substantial force, for example about 100 grams, to urge bodies of solder on the bonding pads of the device against terminal portions of the printed circuit wiring. Since the solder is relatively soft, it will tend to flatten under the aforementioned pressure so that each body of solder engages its corresponding terminal portion, even if some bodies of solder initially are higher than the others. Urging the components together ensures the engagement of each connections, which is important because the soldering is carried out without the use of flux. Heat for soldering is applied by way of a heated probe positioned in contact with the microcircuit device, while a curtain of nitrogen is directed toward the printed wiring board along the periphery of the device. After the solder has cooled and hardened, the assembly is reheated, conveniently by use of radiant heat, to remelt the solder without application of pressure. As the solder is remelted, the device tends to float upon the remelted solder bodies confined by surface tension. This action causes the device to align itself precisely in a final position that places minimum strain on the solder bonds.

Advantageously, the above-described two-step soldering process insures that each of the contact pads is reliably soldered to its associated printed circuit terminal portion, and that the microcircuit device has been elevated from the printed circuit board except at the solder bonds.

The general objectives and advantages of the invention will be more clearly understood from a consideration of the following description, taken in light of the accompanying drawing.

DESCRIPTION OF THE PREFERRED EMBODIMENT

Figure 1:
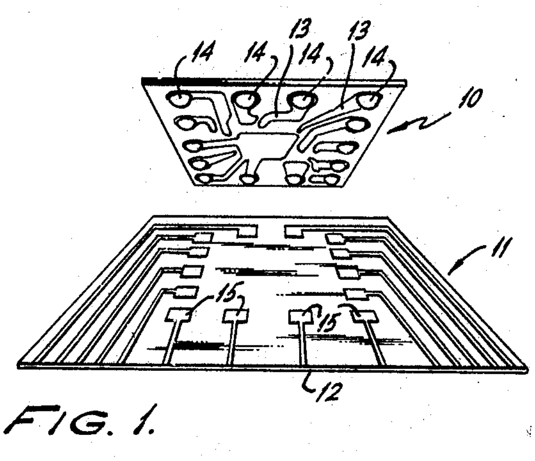
FIGURE 1 is a perspective view, on a considerably enlarged scale, of apparatus adapted for assembly according to the method contemplated by the present invention.

With more particular reference to the drawing, and first to FIGURE 1, a microcircuit device 10 is shown spaced above a printed circuit board 11 upon which it is to be mounted in accordance with the method contemplated by the present invention. As is seen in the drawing, microcircuit device 10 includes a body portion having therein circuit elements (not shown) to which are connected lead wires 13 that extend across the surface of the body portion. Bonding pad portions of lead wires 13 have bodies of solder 14 disposed thereon in positions directly opposite corresponding printed circuit terminal portions 15 provided on the circuit board.

Figure 2:
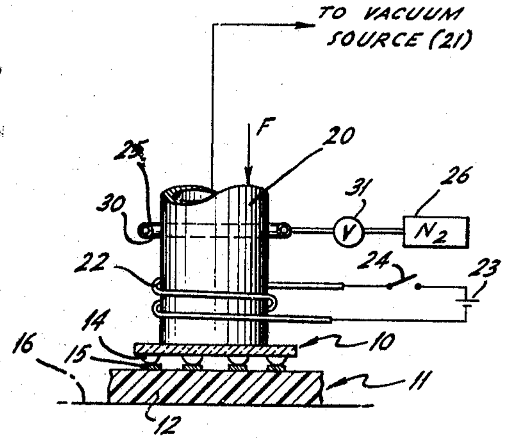
FIGURE 2 is partially assembled apparatus of the type shown in FIGURE 1, with parts broken away, and illustrating somewhat diagrammatically apparatus utilized in carrying out the method contemplated by the invention.
Figure 3:
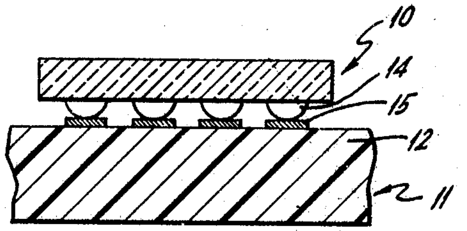

With reference to FIGURES 2 and 3, microcircuit device 10 is shown positioned atop printed circuit board 11 so that bodies of solder 14 abuttingly engage corresponding terminal portions 15 of the printed wiring circuit. However, it will be understood that showing of this ideal condition is for illustrative purposes only, and that it may not exist in instances where uniformity of dimensions does not exist. For example, one or more bodies of solder 14 may not abuttingly engage a terminal portion 15, due, for example, to differences in heights of the solder bodies 14 or in thicknesses of terminal portions 15. It will be appreciated from what follows that the process contemplated by the invention compensates for such disparities as described above. In FIGURE 2, printed wiring board 11 is disposed upon a diagrammatically illustrated work surface 16, and microcircuit device 10 is shown positioned thereon by a vacuum needle or probe 20. The vacuum needle comprises a hollow rod-shaped member the end of which comprises, preferably, an electrically insulative heat resistive material, such for example as alumina or beryllia. The tip of probe 20 is flat, so that it may engage and seal against the upper surface of microcircuit device 10. As is shown somewhat diagrammatically, the other end of probe 20 is connected to a vacuum source 21 so that, upon touching the probe to device 10 and drawing a vacuum, it is possible to hold the device and to position it upon printed circuit board 11. Additional apparatus for carrying out the invention includes an electrical heating coil 22 disposed about the probe and energizable from a source of energy 23 under the control of a switch 24.

A hollow coil 25 is disposed about probe 20 and is connected through a valve 31 to a source of nitrogen 26. Hollow coil 25 includes downwardly presented openings 30 along its length, so that upon opening valve 31, nitrogen will be caused to flow downwardly over edges of device 10, to form a curtain protective of marginal portions of board 11, as mentioned below. Means is also provided, as is indicated by the arrow labeled F, to direct a downward force upon the needle, preferably about 100 grams, when carrying out the method.

Figure 4:
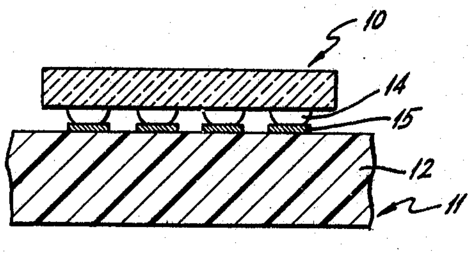
Figure 5:
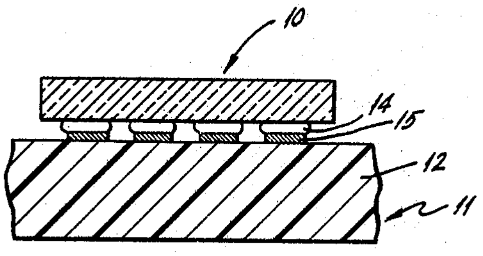

Referring again to the somewhat enlarged showing of apparatus in FIGURE 3, from which figure vacuum probe 20 has been omitted for the sake of convenience, microcircuit device 10 is so placed, using the vacuum probe, that each of the bodies of solder 14 are disposed opposite corresponding terminal portion 15 of the printed wiring lead on printed circuit board 11. Force is then applied through the needle to the microcircuit device slightly to compress the bodies of solder as seen in FIGURE 4, thereby to ensure proper contact. Nitrogen supply valve 31 is opened and the heating coil switch 24 is closed. Heat flows from coil 22 into probe 20 and thence into device 10, to melt the solder. While none has been shown, it will be understood that temperature sensing means, such as a thermocouple, may be provided in the region of engagement of heater coil 22 with probe 20 to ensure against application of excessive heat to the system. A timer may also be included to aid in control of the soldering temperature. The molten solder takes somewhat the form shown in FIGURE 5. Outflow of the solder onto the printed circuit leads radiating from the terminal portions toward the margins of the board is inhibited by the cooling effect of the nitrogen curtain. The curtain of nitrogen also serves as the sole fluxing agent and minimizes oxidation. After solder 14 has been melted, heater switch 24 is opened and nitrogen valve 31 closed. The probe, heater coil, and nitrogen coil are then removed.

Figure 6:
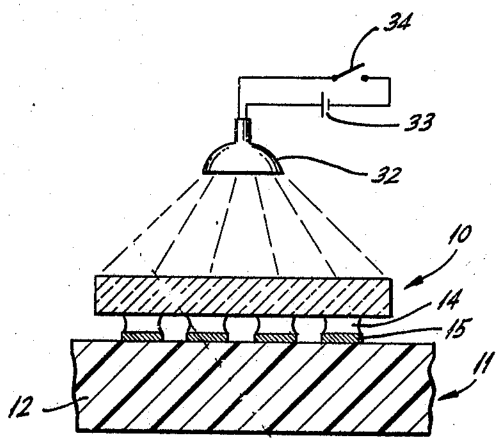

As a further step in the method, the solder is remelted. This can be accomplished conveniently by use of a radiant heater 32, such, for example, as the infrared lamp shown in FIGURE 6, which is energized from a source of energy 33 by closing a switch 34 associated therewith, whereupon the solder is remelted. Importantly, however, remelting is accomplished without the application of the compressive force since it is desired that the microcircuit device float atop the bodies of molten solder. Each of the bodies of molten solder 14 assumes a column-shaped or pillar-shaped form, and each is confined by surface tension to the printed circuit terminal portions and the microcircuit device bonding pads. This action cause the device to align itself precisely in a final position that places minimum strain on the solder bonds.

Figure 7:
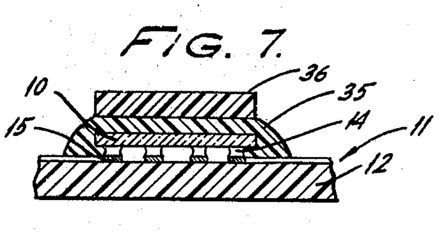
FIGURES 3 to 7 are illustrative of the steps that characterize the invention and of additional apparatus used in practice thereof.

To complete the assembly, and as illustrated in FIGURE 7, the soldered device is covered with a small drop of epoxy resin 35, followed by applying a small disk or "cap" 36 of an epoxy impregnated Fiberglas composition onto the epoxy resin before it is cured. Positioning of cap 36 in this manner prevents flattening of the drop of resin to uncover part of the device, as the resin tends to "wet" the upper surface of the circuit board. The resin clings to the cap, by surface tension, and covers the device.

The assembly is then ready for installation in its intended environment, where connections are made to the exposed circuits connected to terminal portions 15 on board 11.

By way of summary, the urging together of device 10 and circuit board 11 prior to application of heat ensures contact of all bodies of solder 14 with terminal portions 15. This step, taken with the direction of a curtain of nitrogen over the members being joined, eliminates the need for application of fluxing material to the members upon application of heat to melt the solder. Remelting the solder to permit the device to float both increases the spacing between the devices and the circuit board, and serves to relieve stresses in the solder connections.

I claim:

1. The method of soldering the bonding pads of an integrated microcircuit device to a printed circuit board, comprising the steps of: disposing the pad-carrying face of such device downwardly with bodies of solder between said bonding pads and upwardly facing terminal portions of said circuit board; applying heat to melt said solder while applying force to urge said device and said board together; allowing said solder to solidify; applying heat to remelt said solder without the application of force to permit said device to float upon said solder and thereby increase the spacing between said device and said board; and allowing the solder to solidify.

2. The method according to claim 1, and characterized in that heat is first applied to said solder by conduction through said device, and in that heat is applied to remelt said solder by radiant heat caused to impinge upon said device.

3. The method according to claim 2, and further characterized by the directing of jets of nitrogen to form a gaseous curtain about said device while melting said solder by conduction.

4. The method according to claim 1, and characterized further by the additional steps of applying a drop of epoxy resin over said device and adjacent portions of said board, disposing a member atop said drop to prevent its spreading, and permitting said drop of epoxy resin to solidify.

5. The method of soldering the bonding pads of an integrated microcircuit device to terminal portions of a circuit board, comprising the steps of: disposing such device with bodies of solder between said bonding pads and terminal portions of a circuit board; urging said device and said circuit board together; melting said bodies of solder and thereafter allowing them to solidify to form a solder bond; remelting said bodies of solder without the application of force to permit said device to float upon said bodies of solder thereby to increase the spacing between said device and said board; and allowing the solder to solidify.

6. The method according to claim 5, and characterized further in that said board is disposed with said terminal portions presented upwardly and said device is disposed with said bonding pads presented downwardly.

7. The method according to claim 6, and characterized in that the first recited melting of solder is achieved by conducting heat into said device, and the remelting of solder is achieved by causing radiant heat to impinge upon said device.

8. The method according to claim 7, and characterized further by the additional step of directing jets of nitrogen to form a gaseous curtain about said device while melting said solder by conduction.

9. The method according to claim 5, and characterized in that the first recited melting of solder is achieved by conducting heat into said device, and the remelting of solder is achieved by directing radiant heat onto said device.

10. The method according to claim 5 and characterized further by the additional steps of applying a drop of epoxy resin over said device and adjacent portions of said board, disposing a member atop said drop to prevent its further outflow onto said board, and permitting said resin to solidify.

References Cited

UNITED STATES PATENTS 3,292,240 12/1966 McNutt et al. ________ 29—626

(Other references on following page)

References Cited

| | | | |
|---|---|---|---|
| 3,239,719 | 3/1966 | Shower | 29—626 |
| 3,226,804 | 1/1966 | Hasenclever | 29—471.1 XR |
| 3,374,537 | 3/1966 | Doelp | 29—471.1 XR |
| 3,429,040 | 2/1969 | Miller | 29—626 |
| 3,392,442 | | Napier et al. | 29—502 |

JOHN F. CAMPBELL, Primary Examiner

R. B. LAZARUS, Assistant Examiner

U.S. Cl. X.R.

29—471.1, 487, 497, 502; 317—101